(12) United States Patent
Cole et al.

(10) Patent No.: US 10,816,574 B2
(45) Date of Patent: Oct. 27, 2020

(54) HIGH INSERTION COUNT TEST SOCKET

(71) Applicant: YAMAICHI ELECTRONICS USA, INC., San Jose, CA (US)

(72) Inventors: Adam Cole, Santa Clara, CA (US); Jeffrey McCallion, Sunnyvale, CA (US)

(73) Assignee: YAMAICHI ELECTRONICS USA, INC., San Jose, CA (US)

( * ) Notice: Subject to any disclaimer, the term of this patent is extended or adjusted under 35 U.S.C. 154(b) by 80 days.

(21) Appl. No.: 15/867,430

(22) Filed: Jan. 10, 2018

(65) Prior Publication Data

US 2019/0212362 A1    Jul. 11, 2019

(51) Int. Cl.
*G01R 1/04* (2006.01)
(52) U.S. Cl.
CPC .................... *G01R 1/0466* (2013.01)

(58) Field of Classification Search
None
See application file for complete search history.

(56) References Cited

U.S. PATENT DOCUMENTS

| | | | |
|---|---|---|---|
| 6,099,597 A * | 8/2000 | Yap | G01R 1/0408 29/25.01 |
| 6,262,581 B1 * | 7/2001 | Han | G01R 31/2884 324/756.02 |
| 2017/0045551 A1 * | 2/2017 | Hwang | G01R 31/26 |

* cited by examiner

*Primary Examiner* — Jas A Sanghera
(74) *Attorney, Agent, or Firm* — Womble Bond Dickinson (US) LLP

(57) ABSTRACT

A test socket and method for using the same are disclosed herein. In one embodiment, the test socket comprises a base having a top loading area, an actuator rotatably coupled to the base, and a pushing device rotatably coupled to the actuator, where the pushing device is pressed against a semiconductor device when the semiconductor device is placed onto the top loading area and the actuator is moved to a first position (e.g., a test position).

17 Claims, 5 Drawing Sheets

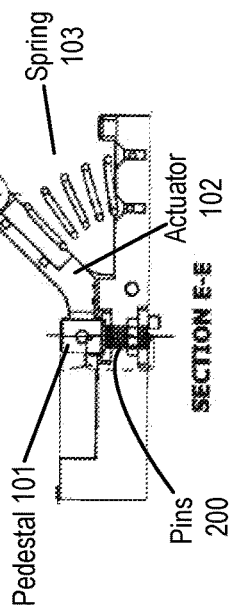
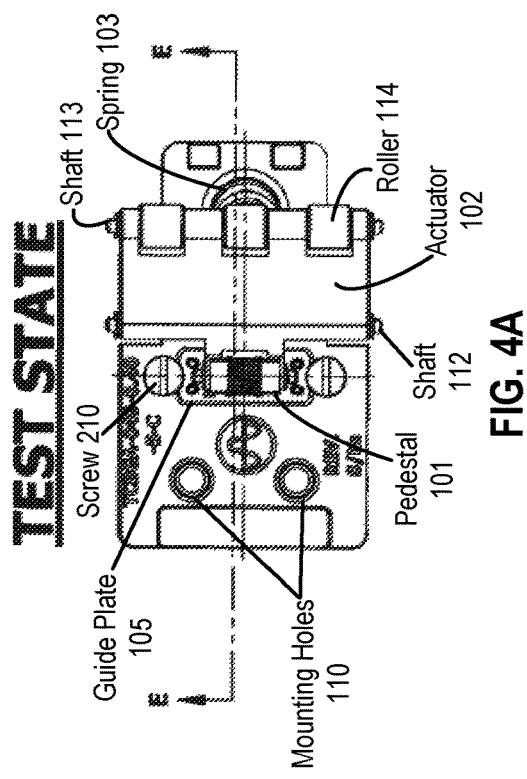
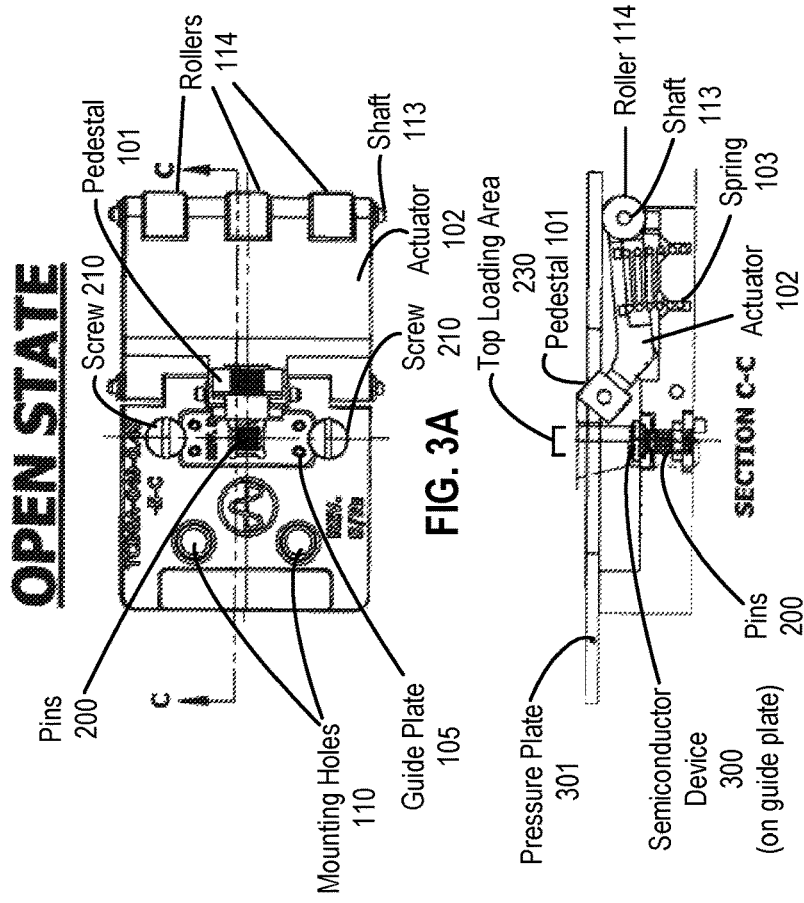
FIG. 4A
FIG. 4B
FIG. 3A
FIG. 3B

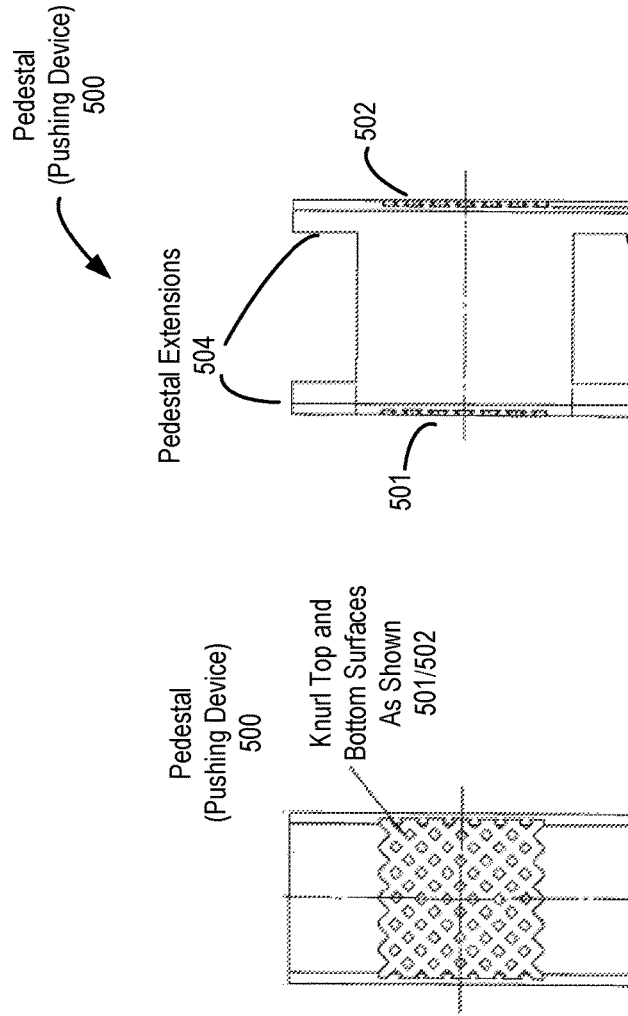
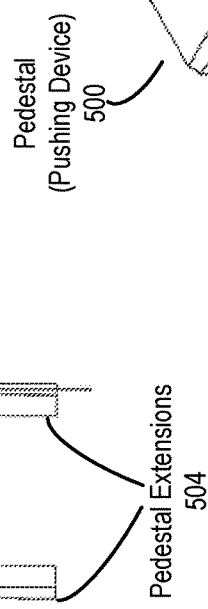
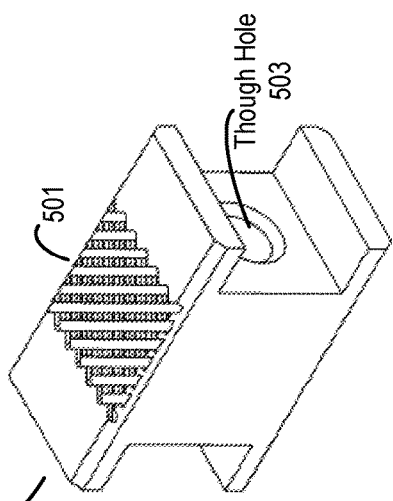
FIG. 5A
FIG. 5B
FIG. 5C

HIGH INSERTION COUNT TEST SOCKET

FIELD OF THE INVENTION

Embodiments of the present invention relate to the field of test sockets for programming and testing of semiconductor devices; more particularly, embodiments of the present invention relate to a socket having a mechanism to position a pushing device onto a semiconductor device placed in the socket in an automated fashion.

BACKGROUND

Sockets are used in the electrical circuit test industry as an interface between a circuit board and a semiconductor device like an integrated circuit (IC) chip. A socket is typically configured to receive a particular configuration of an IC. Electrical spring contact probes, or pins, in the socket extend to the other side of the socket and contact a circuit board on which the socket is mounted. The sockets and their loaded probes establish an electrical contact path between the semiconductor device and the circuit board.

Typically, burn-in sockets are often used in automated programming machines. In such cases, a semiconductor device is placed into such a socket, and the socket is closed by moving a lid on the socket. When the lid is closed, it causes the semiconductor device that was placed into the socket to be pressed down onto signal pins. The signal pins are often integrated into the test socket and have a short life. This short life causes the socket to be used for a limited number of times, such that the test socket has a low insertion count.

SUMMARY OF THE INVENTION

A test socket and method for using the same are disclosed herein. In one embodiment, the test socket comprises a base having a top loading area, an actuator rotatably coupled to the base, and a pushing device rotatably coupled to the actuator, where the pushing device is pressed against a semiconductor device when the semiconductor device is placed onto the top loading area and the actuator is moved to a first position (e.g., a test position).

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 3A and 3B illustrate a top and side section view of an open state of the test socket of FIG. 1.

FIGS. 4A and 4B illustrate a top and side section view of a test state of the test socket of FIG. 1.

FIGS. 5A-5C illustrate one embodiment of a pedestal of a test socket.

DETAILED DESCRIPTION OF THE PRESENT INVENTION

Figure 1:
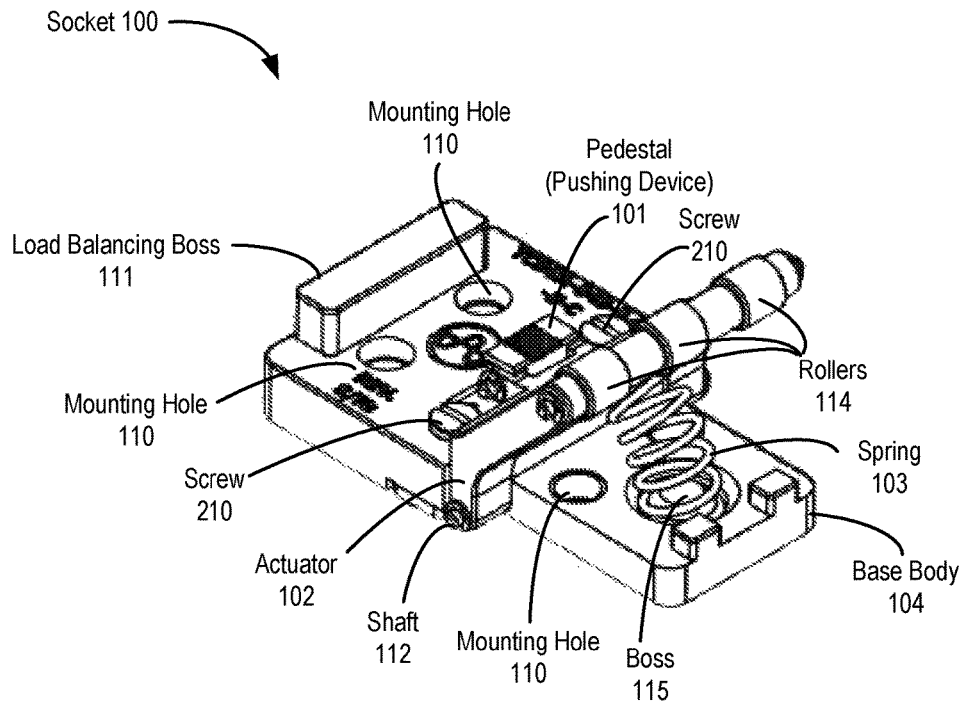
FIG. 1 is a perspective view of one embodiment of a test socket.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

A test socket and method for using the same are disclosed. In one embodiment, the socket comprises a base with a top loading area, an actuator rotatably coupled to the base, and a pedestal, or pushing device, rotatably coupled to the actuator, where the pushing device contacts the top of a semiconductor device when the semiconductor device is placed onto the top loading area and the actuator is moved (e.g., rotated) to a first (test) position (e.g., one end of the actuator is moved (e.g., rotated) away from the base of the socket). In one embodiment, the actuator may be moved to a second (open) position at which the pedestal is positioned outside of an area above the top loading area so that it no longer obstructs access to the semiconductor device via the top loading area.

In one embodiment, the pedestal, or pushing device, includes a surface having a flat portion that makes contact across a top surface the semiconductor device when the pedestal pushes down a guide plate holding the semiconductor device as the actuator is moved into the test position, thereby pushing the semiconductor device into contact with and onto the pins (e.g., signal probes). In one embodiment, the surface comprises a pattern (e.g., a knurl patterned surface) that prevents a vacuum seal from forming between the surface and the top surface of the semiconductor device. In one embodiment, the pedestal comprises an electrostatic discharge (ESD) material (e.g., Semitron ESD 410C).

In one embodiment, the test socket includes a spring (e.g., a side loaded, curved spring) positioned between the actuator and the base. In one embodiment, the spring is in a first compressed state and applies force to cause the pushing device to push down onto the semiconductor device when the semiconductor device is placed onto the top loading area and the actuator is moved (e.g., rotated) to a test position, and the spring is in a second compressed state, which is a more compressed state than the first compressed state, when the actuator is moved (e.g., rotated) to an open position at which the pushing device is positioned outside of an area above the top loading area.

FIGS. 1-5C illustrate one embodiment of the test socket. In one embodiment, the socket is part of an automatic programming machine and includes pushing device for making a connection between a semiconductor device and signal pins (probes) of the socket. In one embodiment, this pushing device can be actuated in an automated fashion by an actuator that is moved up and down using a substrate (e.g., a pressure plate). In one embodiment, an actuator arm is rotated back toward the base body of the test socket in order to open the test socket or rotates up to press the pushing device against a semiconductor device, which causes the semiconductor device to be pushed into contact with and onto the signal pins.

Referring to FIG. 1, test socket 100 includes base body 104 and an actuator (rocker) 102 that is rotatably coupled to base body 104. In one embodiment, the coupling of actuator (rocker) 102 to base body 104 is near the bottom of base body 104 via shaft 112 and e-rings that hold shaft 112 in place.

Pedestal 101 is rotatably coupled to actuator 102. In one embodiment, the coupling of pedestal 101 to actuator 102 is via a shaft and e-rings to hold the shaft in place. Pedestal 101 operates as a pushing device to push or press against a semiconductor device that is placed into a guide plate in socket 100 when actuator 102 is moved to a particular position, thereby causing the pedestal to push the semiconductor device up against the signal pins. More specifically, when actuator 102 is rotated about shaft 112, actuator 102 moves to a more upright position with respect to base body 104, which causes pedestal 101 to move to a position in which it contacts a guide plate attached to base body 104 into which a semiconductor device (not shown) that had been placed. As the movement of actuator 102 continues to the more upright position, pedestal 101 contacts the guide plate and is able to press against the semiconductor device (not shown), which presses against programming pins (not shown) that are below the semiconductor device in test socket 100. At this point, the semiconductor device can be programmed and/or tested.

When actuator 102 is moved away from the semiconductor device and away from its more upright position (with an end of actuator 102 moving towards base body 114), the movement causes pedestal 101 to be moved from on top of the semiconductor device. When moving actuator 102 is rotated away from the semiconductor device, pedestal 101 is moved to a location in which it is no longer above the semiconductor device. This enables the semiconductor device to be removed from test socket 100 without contacting pedestal 101 and/or enables a new semiconductor device to be inserted into the test socket 100 without contacting pedestal 101.

In one embodiment, the movement of actuator 102 is caused, at least in part, by spring 103. Spring 103 applies a force to actuator 102 that causes actuator 102 to be moved towards the semiconductor device and causes pressure to be applied to pedestal 101 to press the semiconductor device against the pins (e.g., signal probes) in test socket 100. In one embodiment, spring 103 is a side loaded, compression spring having one end that that sits in a cavity in base body 114 with a boss 115 in the cavity and extending into the inner portion of one end of spring 103. The other end is set in a cavity on the back side of actuator 102 that also includes a boss (not shown) that extends into the inner portion of the other end of spring 103.

Referring back to FIG. 1, actuator 102 includes one or more rollers 114. In one embodiment, rollers 114 are rotatably coupled to an end of actuator 102 via shaft 113. Rollers 114 roll along a substrate (e.g., a pressure plate) while the substrate is moving, thereby causing actuator 102 to be pushed down and lowered against the pressure put forth by spring 103. That is, rollers 114 roll along the substrate to facilitate the application of the force by the substrate onto actuator 102. In one embodiment, rollers 114 also rolls and remains in contact with the substrate as the substrate is raised until actuator 102 reaches its most upright position.

Socket 101 also includes a load balancing boss 111 that acts as a hard stop for use when a force is applied to actuator 102 to lower the top of actuator 102 towards base body 104 and prevents the substrate from moving to far down with respect to socket 101.

Figures 2A, 2B, 2C:
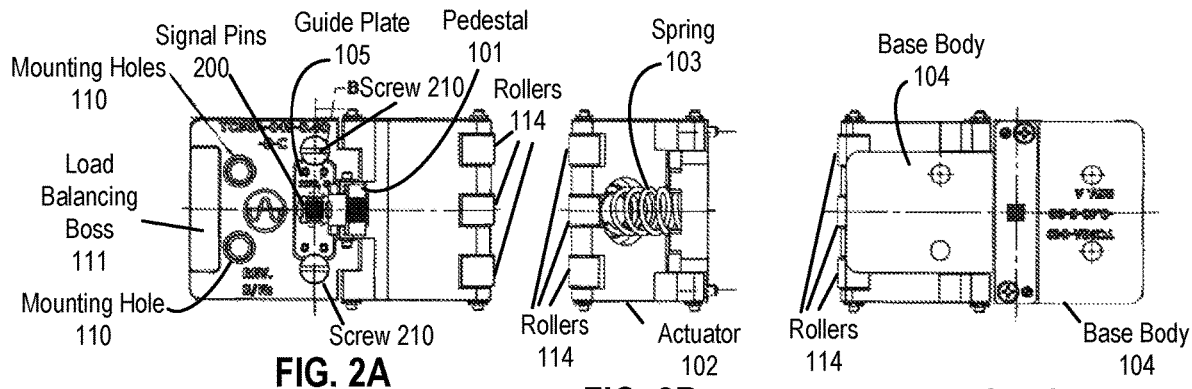
FIGS. 2A-2E illustrate top and side views of one or more parts of the test socket of FIG. 1.

Test socket 100 also includes mounting holes 110 that are used to secure test socket 100 to a substrate, such as a printed circuit board in a manner well-known in the art. Test socket 100 also includes screws 210 that are used to secure a guide plate (FIG. 2A). The guide plate 105 includes a location onto which a semiconductor device may be placed for purposes of programming and/or testing. In one embodiment, this location holds the semiconductor device on guide plate 105 and makes contact with pedestal 101 when pedestal 101 contacts the semiconductor device and pushes the semiconductor device against signal pins 200. This prevents the semiconductor device from being damaged when testing occurs.

FIGS. 2A-E, 3A-B, and 4A-4B illustrate the open and test states of one embodiment of the socket and will be discussed in more detail below.

Figure 2D:
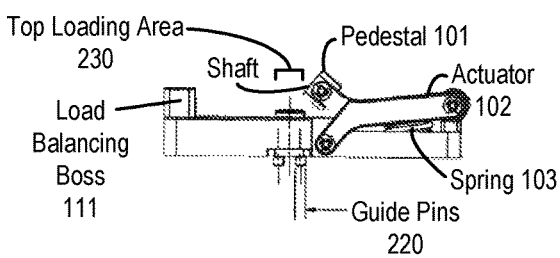

More specifically, FIGS. 2A, 2C, and 2D illustrates the test socket in the open state (positions), FIG. 2B illustrates the test socket in the closed state, FIGS. 3A-3B illustrate a set of views of test socket 101 in an open state, and FIGS. 4A-4B illustrate a set of views of test socket 101 in an open state.

Figure 2E:
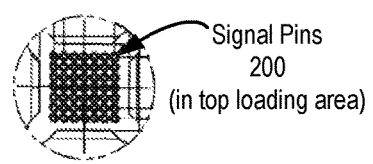

In the open state (position), an end of actuator 102 that is not coupled to base body 104 is positioned close to base body 104 and away from the semiconductor device placement location in test socket 100 (e.g., the location on guide plate 105). In this open state, spring 103 is in its most compressed state. Referring to FIG. 2A, when actuator 102 is moved (e.g., rotated) to the open position, pedestal 101 is moved to a position where it is no longer pushing against a semiconductor device and is out of the way of the top loading area above the semiconductor device placement location in test socket 100. In FIG. 2A, the semiconductor device placement location is in guide place 105 where signal pins 200 are located. FIG. 2E is a detailed view of signal pins 200 below the top loading area. In one embodiment, guide plate 105 is mounted to base body 104 using a pair of screws 210.

FIG. 2D illustrates, in one embodiment, guide plate 105 which allows the semiconductor device to hover and be retained above test socket 100. This helps with seating and preventing the creation of a vacuum between pedestal 101 and the semiconductor device when pedestal 101 presses down on the semiconductor device.

FIG. 2B illustrates a side view of one embodiment of the test socket in the test state. Referring to FIG. 2B, spring 103 is shown in a less compressed state than in the open state.

FIG. 2C illustrates a bottom view of one embodiment of the test socket in the open position.

FIG. 2D illustrates a side view of the test socket in the open state. Referring to FIG. 2D, a top end of actuator 102 that is not coupled to base body 104 is located near base body 104. In this position, pedestal 101 is moved out of the way of the top loading area above signal pins 200 onto which a semiconductor device is placed for programming. This enables placement of the semiconductor device for programming and removal of semiconductor device after programming.

FIGS. 3A and 3B illustrate the open state of the test socket, while FIGS. 4A and 4B illustrate the test state of the test socket. FIG. 3A is a view similar to FIG. 2A. FIG. 3B is a side section view of the open state of the test socket. Referring to FIG. 3B, a pressure plate 301, or other substrate, presses down on rollers 114 of actuator 102, thereby causing spring 103 to be compressed and pedestal 101 to be raised and moved away from the semiconductor device location of test socket 104 such that it no longer obstructs the top loading area above the semiconductor device location in test socket 101. As shown, in one embodiment, pedestal 101 is moved to a location that extends through an open or cutout area in pressure plate 301.

FIGS. 4A and 4B illustrate one embodiment of the test socket in the test state (test position). Referring to FIG. 4A, in the test state, pedestal 101 is located on top of and pressed against the semiconductor device on guide plate 105. In the test state, pedestal 101 presses the semiconductor device located on guide plate 105 onto signal pins 200 with a force received from spring 103 pushing up actuator 102 to a nearly upright position. Actuator 102 reaches the test state after pressure plate 301 was raised, allowing the uncoupled end of actuator 102 to raise up due to the force exerted by spring 103.

In one embodiment, spring 103 is such that when pressure plate 301 is no longer applied to actuator 102, a force applied by spring 103 is sufficient to cause pedestal 101 to push against the semiconductor device and causing the semiconductor device to contact and press against the pins of the test socket, yet it does not put on undue stress onto the semiconductor device when actuator 102 is rotated towards base body 104. Subsequently, actuator 102 is moved to position (e.g., the test sockets open position) in which pedestal 101 is no longer above the top loading area of test socket 100 for the semiconductor device.

In one embodiment, test socket 100 includes only one compression spring. In alternative embodiments, test socket 100 includes more than one spring for applying pressure between base body 104 and actuator 102. In one embodiment, spring 103 is preloaded so that it's still in a compressed state when test socket 100 is in the test position and pedestal 101 pushes the semiconductor device onto signal pins 200 in test socket 100. In one embodiment, spring 103 is made of stainless steel.

In one embodiment, spring 103 is a side-loaded compression spring and is not attached to test socket 100, and bosses in both the back of actuator 102 and the bottom of base body 104, such as, for example boss 115 of FIG. 1, hold spring 103 in place.

In one embodiment, pedestal 101 is shaped as an I-beam and has a knurl pattern. In one embodiment, pedestal 101 is mounted in such a way that it rotates slightly on an arm of actuator 102 in such a way that when it comes down and touches the top surface of the guide plate holding the semiconductor device, it does so in a flattened manner that distributes the force evenly across the top of the semiconductor device such that the top of the semiconductor device is pressed against pedestal 101 substantially evenly when the semiconductor device is pressed against the signal pins.

Figure 7:
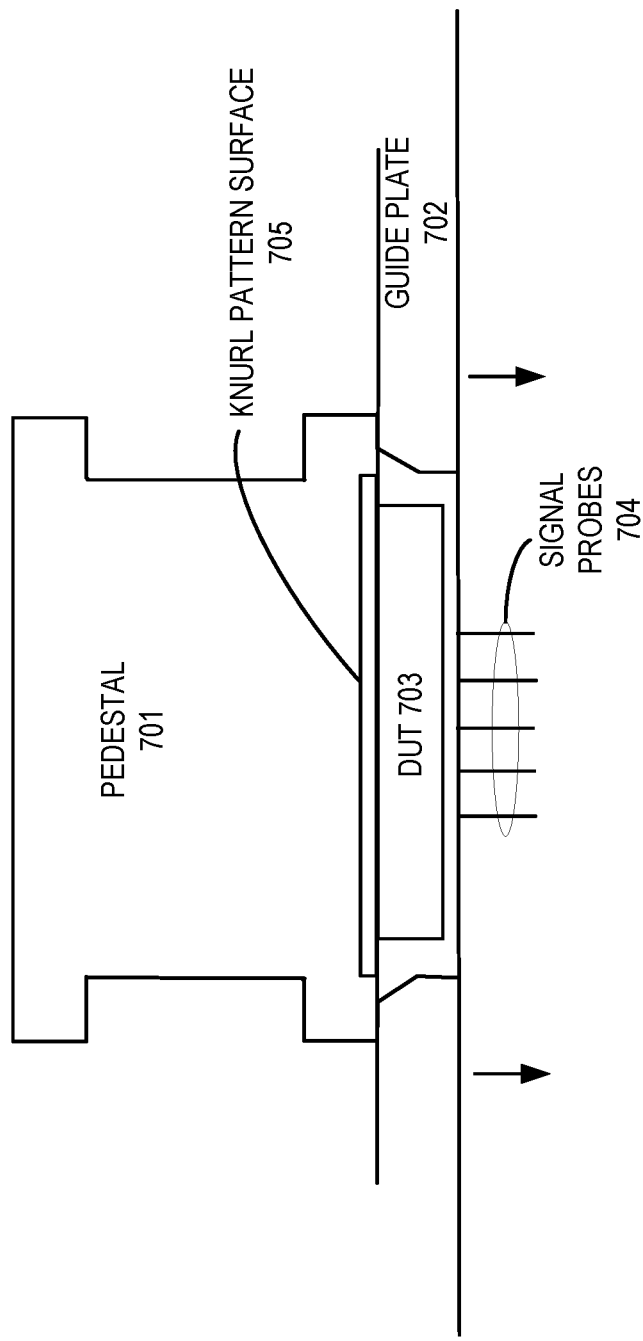
FIG. 7 illustrates a pedestal in contact with a guide plate when the test socket is in a test mode in accordance with one embodiment.

FIG. 7 illustrates a pedestal in contact with a guide plate when the test socket is in a test mode in accordance with one embodiment. Referring to FIG. 7, when the actuator is moved into the test position, pedestal 701 contacts guide plate 702 and causes guide plate 702 to move downward. This causes the semiconductor device, referred to as device-under-test (DUT) 703, to be pushed downward and contact signal probes 704. Because pedestal 701 is under the force due to the spring pushing against the actuator coupled to pedestal 701, pedestal 701 presses against DUT 703 to hold it in place while signal probes 704 press against DUT 703.

FIG. 5A-5C illustrates one embodiment of a pedestal, or pushing device, of a test socket. Referring to FIG. 5A, pedestal 500 includes a surface that prevents a vacuum seal from being created between pedestal 500 and a semiconductor device when pedestal 500 is placed on top of, and presses against, the semiconductor device to push the semiconductor device onto pins in the test socket. In one embodiment, this surface is a knurl pattern surface. FIG. 5A illustrates one surface of pedestal 500 have a knurl pattern 501. In one embodiment, the knurl patterned surface is on both sides of pedestal 500 as shown as knurl surfaces 501 and 502 in FIG. 5B. Note that that placement of the knurl pattern on both sides is for the purposes of ease of manufacturing in that the top and bottom of pedestal 500 may be interchanged. In another embodiment, only one side of pedestal 500 has a knurl patterned surface.

In alternative embodiments, other patterns may be used to prevent a vacuum from occurring between pedestal 500 and the semiconductor device as a result of pedestal 500 being pressed against the semiconductor device.

In one embodiment, the material used for the knurl pattern is an electrostatic discharge material that prevents buildup of static electricity. In one embodiment, the material is a Semitron ESD 410C material.

In one embodiment, the knurl pattern is also beneficial and helps reduce any amount of marking in the package during programming test. The size of the knurl pattern is such that it is slightly larger than the semiconductor device upon which the knurl pattern is pushing when the pedestal is being pushed on the semiconductor package.

In one embodiment, as shown in FIG. 3, pedestal 500 includes a through hole 503 for use with a shaft in coupling to an actuator (e.g., actuator 102 of FIGS. 1-4B discussed above).

Figure 6:
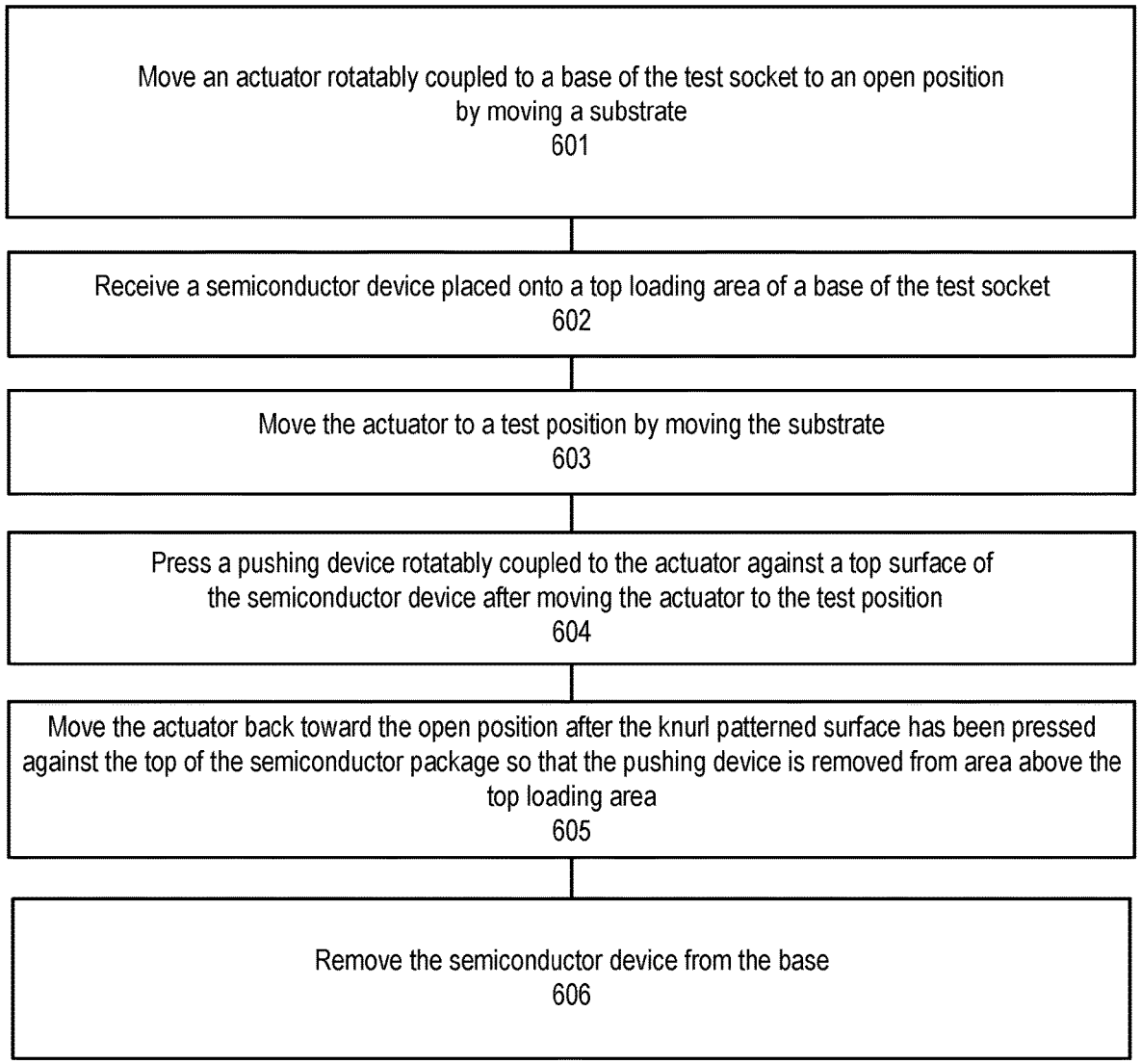
FIG. 6 is a flow diagram of one embodiment of a process for using a socket.

FIG. 6 illustrates one embodiment of a process for programming a semiconductor device using a test socket. In one embodiment, the process is performed using a socket, such as, for example, the sockets described above.

Referring to FIG. 6, the process begins by moving an actuator (e.g., actuator 102 of test socket 100) of the test socket (which is rotatably coupled to a base of the test socket) to a first position by moving a substrate that is in contact with the actuator, causing a pushing device rotatably coupled to the actuator to be moved so that the pushing device is not located over a top loading area of a base of the test socket when the actuator is in the open position (processing block 601). In one embodiment, the top loading area is above a guide plate that has an area above signal pins that are to contact the semiconductor device package during programming.

In one embodiment, an end of the actuator that is not coupled to the base is moved toward the base while rotating another end of the actuator that is rotatably coupled to the base. In one embodiment, the substrate comprises a pressure plate of an automated programming machine. In one embodiment, the pressure plate contacts an end of the actuator that is not coupled to the base as the pressure plate moves down, thereby causing that end of the actuator to move towards the base. In one embodiment, a spring (e.g., spring 103 of test socket 100) provides a force against the actuator while the pressure plate moves down and applies pressure against the actuator. In one embodiment, rollers (e.g., rollers 114 of test socket 100) on the end of the actuator contacting the pressure plate roll along the pressure plate as the pressure plate is moved down.

Once at the open position, a semiconductor device is received and placed onto the base of the test socket, via the top loading area (processing block 602). In one embodiment, a pick and place machine picks up the semiconductor device and places it on an area above signal pins that are to contact the semiconductor device's package.

After the semiconductor device has been placed on the guide plate, the actuator is moved to a test position by moving the substrate (processing block 603). In one embodiment, the substrate (e.g., pressure plate) is in contact with one or more rollers coupled to the actuator and the movement of the substrate upward releases pressure on the rollers, thereby allowing the end of the actuator coupled to the rollers to rise via a pushing force from below the actuator.

In one embodiment, a spring (e.g., spring 103 of test socket 100) provides a force against the actuator while the pressure plate moves up to move the actuator toward the test position. In one embodiment, rollers (e.g., rollers 114 of test socket 100) on the end of the actuator contacting the pressure plate roll along the pressure plate as the pressure plate is moved up. In one embodiment, the pressure plate is no longer in contact with the actuator when the actuator is in the second position.

When the actuator is in the test position, the pushing device (e.g., pedestal of test socket 100) rotates onto a top surface the guide plate and pushes down slightly onto the semiconductor device, thereby pressing the semiconductor device onto the pins (signal probes) (processing block 604). In one embodiment, a spring (e.g., spring 103 of test socket 100) provides a force against the actuator, which causes the pedestal to be pushed onto the guide plate with enough force to hold the semiconductor device in place while the pins of the socket are pressed into the semiconductor device. In one embodiment, the pushing device includes the knurl patterned surface that comes into contact with the top of the semiconductor device and is makes contact with the top of the semiconductor device. In one embodiment, the knurl patterned surface of the pushing device that contacts the top of the semiconductor device prevents a vacuum seal from occurring between the surface of the pushing device and the top surface of the semiconductor device when the pushing device makes contact with the top of the semiconductor device.

At this point, the semiconductor device may undergo programming and/or testing.

After programming and/or testing, the actuator is moved back toward the first position so that the pushing device is removed from the area above the top loading area (processing block 605) and the semiconductor package is removed from the base of the socket (processing block 606).

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A socket comprising:
    a base having a top loading area;
    an actuator rotatably coupled to the base; and
    a pushing device rotatably coupled to the actuator, wherein the pushing device is pushed against a semiconductor device when the semiconductor device is placed onto the top loading area and the actuator is moved to a first position, wherein a flat portion of a crisscross knurl patterned surface of the pushing device is operable to make contact across a top surface of the semiconductor device when the pushing device contacts the semiconductor device as the actuator is moved into the first position.

2. The socket defined in claim 1 wherein the knurl patterned surface comprises a pattern operable to prevent a vacuum seal from occurring between the knurl patterned surface and the top surface of the semiconductor device.

3. The socket defined in claim 1 wherein the knurl patterned surface comprises an electrostatic discharge material.

4. The socket defined in claim 1 wherein the actuator is movable to a second position at which the pushing device is positioned outside of an area above the top loading area.

5. The socket defined in claim 1 further comprising a spring positioned between the actuator and the base, the spring being in a first compressed state and applying force to cause the pushing device to press against the semiconductor device when the semiconductor device is placed onto the top loading area and the actuator is moved to the first position, and the spring being in a second compressed state, which is a more compressed state than the first compressed state, when the actuator is moved to a second position at which the pushing device is positioned outside of an area above the top loading area.

6. The socket defined in claim 5 wherein the spring is a side loaded curved spring.

7. A socket comprising:
    a base having a top loading area;
    an actuator rotatably coupled to the base; and
    a pushing device rotatably coupled to the actuator, wherein the pushing device is pushed against a semiconductor device when the semiconductor device is placed onto the top loading area and the actuator is moved to a first position, wherein the pushing device has an I-beam shape.

8. A socket comprising:
    a base having a top loading area;
    an actuator rotatably coupled to the base; and
    a pushing device rotatably coupled to the actuator and having an I-beam shape, wherein the pushing device is pressed against a semiconductor device when the semiconductor device is placed onto the top loading area and the actuator is moved to a first position, wherein the pushing device comprises a knurl patterned surface operable to make contact across a top surface of the semiconductor device when the pushing device contacts the semiconductor device as the actuator is moved into the first position, the knurl patterned surface being operable to prevent a vacuum seal from occurring between the knurl patterned surface and the top surface of the semiconductor device.

9. The socket defined in claim 8 wherein the knurl patterned surface comprises an electrostatic discharge material.

10. The socket defined in claim 8 wherein the actuator is movable to a second position at which the pushing device is positioned outside of an area above the top loading area.

11. The socket defined in claim 8 further comprising a spring positioned between the actuator and the base, the spring being in a first compressed state and applying force to cause the pushing device to press against the semiconductor device when the semiconductor device is placed onto the top loading area and the actuator is moved to the first position, and the spring being in a second compressed state, which is a more compressed state than the first compressed state, when the actuator is moved to a second position at which the pushing device is positioned outside of an area above the top loading area.

12. The socket defined in claim 11 wherein the spring is a side loaded curved spring.

13. A method for operating a test socket, the method comprising:
    moving an actuator rotatably coupled to a base of the test socket to a first position by moving a substrate, a pushing device rotatably coupled to the actuator being moved so that the pushing device is not located over a top loading area of the base of the test socket when the actuator is in the first position;

receiving a semiconductor device placed onto the top loading area of the base of the test socket;

moving the actuator to a second position by moving the substrate that is in contact with the actuator; and pressing the pushing device rotatably coupled to the actuator onto a top surface of the semiconductor device after moving the actuator to the second position, wherein the pushing device has a crisscross knurl patterned surface that contacts the top surface of the semiconductor device and is operable to prevent a vacuum seal from occurring between the knurl patterned surface and the top surface of the semiconductor device when the pushing device is pressed onto the top surface of the semiconductor device.

14. The method defined in claim 13 wherein pressing the pushing device rotatably coupled to the actuator onto the top surface is performed by a spring between the actuator and the base after the substrate is moved beyond a predetermined location.

15. The method defined in claim 13 further comprising moving the actuator back toward the first position after the knurl patterned surface has been pressed against the top surface of the semiconductor device so that the pushing device is removed from an area above the top loading area.

16. The method defined in claim 15 further comprising removing the semiconductor device from the base.

17. The method defined in claim 13 wherein the substrate comprises a pressure plate.

* * * * *